United States Patent [19]
Morant

[11] Patent Number: 5,632,079
[45] Date of Patent: May 27, 1997

[54] PROCESS FOR MAKING INTEGRATED TERMINATING RESISTOR

[75] Inventor: David G. Morant, Mercer Island, Wash.

[73] Assignee: The Boeing Company, Seattle, Wash.

[21] Appl. No.: 469,345

[22] Filed: Jun. 6, 1995

Related U.S. Application Data

[62] Division of Ser. No. 173,328, Dec. 23, 1993.

[51] Int. Cl.$^6$ .................................................. H01C 17/28
[52] U.S. Cl. .................................................. 29/619; 29/621
[58] Field of Search ................................ 29/610.1, 619, 29/621; 338/295, 322, 325

[56] References Cited

U.S. PATENT DOCUMENTS

| | | |
|---|---|---|
| 2,148,098 | 8/1939 | Manifold . |
| 2,498,755 | 8/1950 | Fulmer et al. . |
| 2,548,881 | 2/1951 | Ferrill, Jr. . |
| 2,714,706 | 7/1955 | Masters . |
| 2,994,848 | 8/1961 | Rayburn . |
| 3,217,279 | 11/1965 | Boggs .................................. 338/295 X |
| 3,322,655 | 5/1967 | Garibotti et al. ...................... 29/621 X |
| 3,340,490 | 9/1967 | Obenhaus ............................. 338/322 X |
| 3,384,852 | 5/1968 | Beck et al. ........................... 338/325 X |
| 3,521,201 | 7/1970 | Veteran . |
| 3,710,282 | 1/1973 | Seinecke . |
| 4,032,881 | 6/1977 | Singleton . |
| 4,039,995 | 8/1977 | Walton et al. ........................ 29/621 X |
| 4,199,663 | 4/1980 | Herzog . |
| 4,231,152 | 11/1980 | Kubota et al. ............................ 2/621 |
| 4,264,827 | 4/1981 | Herzog . |
| 4,393,498 | 7/1983 | Jackson et al. . |
| 4,471,481 | 9/1984 | Shaw et al. . |
| 4,472,780 | 9/1984 | Chenoweth et al. . |
| 4,484,213 | 11/1984 | Franklin . |
| 4,513,419 | 4/1985 | Small . |
| 4,595,923 | 6/1986 | McFarland, Jr. . |
| 4,755,929 | 7/1988 | Outous et al. . |
| 4,823,364 | 4/1989 | Herzog . |
| 4,825,450 | 4/1989 | Herzog . |
| 4,968,377 | 11/1990 | Sillner ................................. 29/619 X |
| 5,196,822 | 3/1993 | Gallunner et al. ................. 338/322 X |

FOREIGN PATENT DOCUMENTS

| | | | |
|---|---|---|---|
| 674591 | 11/1963 | Canada ................................ 29/619 |
| 997246 | 11/1952 | France ................................ 338/295 |
| 3935936 | 5/1990 | Germany ........................... 29/610.1 |
| 5679551 | 4/1979 | Japan . |
| 1305797 | 4/1987 | U.S.S.R. . |
| 1465915 | 3/1989 | U.S.S.R. ............................... 29/619 |
| 604470 | 10/1945 | United Kingdom . |
| 655037 | 9/1948 | United Kingdom . |

OTHER PUBLICATIONS

Carl L. Peters, Micorminiature Modular Structure, Nov. 1959 H. Brueckmann, Delay–Line Dummy Load has High Power Rating Jun. 1954.

*Primary Examiner*—Peter Vo
*Attorney, Agent, or Firm*—Lawrence W. Nelson; J. Michael Neary

[57] ABSTRACT

A process for making an integrated terminating resistor on a two-conductor data bus includes making a series of individual resistor elements and assembling the resistor elements in a stack of parallel, spaced array of elements. The elements are soldered together between end portions of the two conductors of the data bus at both ends thereof by inserting the conductors into two diametrically opposed, axially aligned notches in all of the resistor elements and heating solder in the notches to reflow the solder to bond the conductor in the notches. A parallel electrical and mechanicalconnection is thereby established, connecting the elements together electrically and mechanically in a closely spaced array. The array is sealed in a shock absorbing and abrasion resistant enclosure.

5 Claims, 6 Drawing Sheets

Fig. 4

Fig.8 TERMINATION AT FAR END CORRECT

Fig.9 TERMINATION AT FAR END OPEN

*Fig. 10* TERMINATION AT FAR END SHORTED

*Fig. 11* TERMINATION AT NEAR END OPEN

PROCESS FOR MAKING INTEGRATED TERMINATING RESISTOR

This is a division of U.S. application Ser. No. 08/173,328 filed on Dec. 23, 1993, and entitled "High Reliability Fault Tolerant Terminating Resistor". This invention relates to a data bus with an integral terminating resistor, and more particularly to a high reliability, fault tolerant terminating resistor for a data bus and a method for manufacturing the data bus and terminating resistor as an integral unit.

BACKGROUND

Control systems for aircraft in the past utilized a system of cables which operated hydraulic actuators for powering the control surfaces, landing gear, and other systems controlled from the cabin. The weight and space requirements for these cable systems, and the expense of manufacturing, installing, and maintaining them in modern aircraft has inspired an effort to replace them with electronic controls which utilize electrical signals from controllers in the cabin, transmitted over wires, to actuate machinery for moving the airplane control surfaces, hence the name "fly-by-wire" system. These aviation electronic (or avionic) systems must be built with the same or better reliability and fault tolerance than the earlier cable systems had.

A goal of modern avionic systems is to integrate all of the functions for operation and control of the airplane from the cabin into a control system that permits the maximum possible reduction in the weight, space and power requirements of the avionics system, and permits a simplification in wiring between physically separated airplane control surface actuators and other control functions. Such integration would permit the consolidation of all airplane control functions in a single controller in the cabin which would make automatic control of these functions possible, without burdening the pilot or other operating personnel with routine functions, such as operating passenger cabin lights, air conditioning, seat belt signs, and so on.

This desirable integration of all control functions into one consolidated avionics system can be best achieved by the use of a common data bus to which each control function has access through an associated terminal, each of which is capable of transmitting and receiving data. Data transmitted on the data bus by one terminal associated with a particular control function can be received by the terminals associated with remaining control functions, thus eliminating the requirement for separate wiring interconnections between the main controller and each individual control function. In addition, data generated by a particular control function can be used by any other control function and is available anywhere in the airplane without the necessity of having to add separate wiring specifically to access that data.

The most desirable avionic data communication system is an autonomous terminal access data communications system that uses a current mode data bus. The items critical to the usefulness of such a data communication system are the maximum number of data terminals that may be accomodated, the ease with which each terminal is coupled to the data bus, and the reliability of the system components and the bus cable itself. A system employing a current mode data bus of high reliability having these attributes is described in U.S. Pat. No. 4,264,827, and coupling methods and protocol standards for use with this system are disclosed in U.S. Pat. Nos. 4,199,633 and 4,471,481. This system, now identified in the field as ARINC specification 629, uses a multi-transmitter, bi-directional bus instead of the older single transmitter unidirectional (one-way) bus which operated in accordance with ARINC specification 429.

A current mode data bus has the advantage that it does not require electrical connection to the conductor itself but is inductively coupled to the line replacable units with which it communicates and which communicate with it. In this way, it is unnecessary to establish metallic connection with the data bus conductor to connect the functional components to the data bus, so the inherent unreliability of plugs and sockets used in voltage mode connections to the data bus is avoided.

The data bus system described in the aforesaid patents does not require a singular data bus controller, thereby eliminating the possibility of a malfunction of the entire data bus system in the event that such a data bus controller should malfunction. Instead, each controller is autonomous, with the result that, if one controller fails, the overall data bus system continues to operate. Built-in protocols in each terminal that communicates on the bus which require them to independently listen to the bus and to transmit data when certain protocol conditions are met. For example, to receive data, each terminal passively monitors the data bus. Data received by that terminal is validated and passed into the system's addressable memory. To transmit, the terminal maintains a transmission time slot on the bus. Prior to the actual transmission, the terminal first assembles a complete data message, determines when it may transmit, and then sends the message.

The described avionic system is inherently more reliable than the older single transmitter, one-way type bus system in that it does not utilize a single controller to operate the bus and has a simpler wiring configuration. However, the increase in the required reliability of the data bus system imposes a necessity that the reliability of the associated components also increase comensurately to insure that the full benefit of the increased system reliability is realized.

In addition to high reliability, avionics data communication hardware, particularly for use in fly-by-wire systems, must meet high standards of fault tolerance. System reliability is determined in part by the design of the terminating resistor of the data bus, by the manufacturing process and materials by which it is made, and also by the method by which the terminating resistor is connected to the data bus cable itself. The terminating resistor must exceed the required reliability established by the data bus cable itself and the coupling technique used to couple the data bus cable to the line replaceable units. It has been determined that the electrical requirements of the terminating resistor could be met with a variability of 5% from the characteristic impedence $Z_0$ of the data bus cable. In order to accomplish fault tolerance, the resistor must be designed so that failure of any single resistance element does not alter the resistor value by more than five percent.

If the data bus terminators could be shown to have a failure rate less than that of the bus cable alone, once installed and checked out, they would never need reinspection. A terminator of such a data bus can consist of a single resistor which has an extremey low failure rate, however a single point failure of the component or the connections to it causing either an open or a short can cause the data bus to fail. Fault tolerance can be built into a terminator by judicious use of redundancy in the form of parallel resistors. The reliability of the parallel array of resisters is somewhat less than that of a single resistor, but the failure rate still exceeds that of the data bus cable by several orders of magnitude based on an inspection interval equal to the service life of the airplane, and fault tolerance has now been built in.

Such a data bus cable system is advantageous because the methods of testing a data bus to insure against faults could result in decreased reliability, reduction in EMI hardness, and increased complexity and cost. Based on a 20 year service life of an airplane, which results in a projected power-on time of about 110,000 hours, the reliability of the components of a data bus system should be sufficient if they do not exceed the failure rate of the data bus cable itself, which is $10^{-9}$ failures/hour, based on experience with single segments of cable in airplanes. Such a failure rate, based on an inspection interval exceeding the life of the airplane, obviates the need for a permanent or intrusive system in the airplane to check for latent faults in the data bus system. The added complexity of such an intrusive system itself could result in additional degredation of system reliability The function of the terminating resistor is to absorb or sufficiently attenuate signals incident on it so that they are not reflected back into the transmission line at an amplitude where they would cause distortion of the data signal. In order to accomplish this, the resistor value must be equal or close to the characteristic impedance $Z_o$ of the transmission line. Since the exact value of the transmission line characteristic impedence is not known with certainty before the resistor is connected to the line, it would be desirable to provide a means for trimming the resistor to perfectly match its resistance value to the actual measured value of the characteristic impedence of the data bus line. Resistance trimming is a technique for increasing resistance by removing material from a film resistor using a laser or other cutting or abrading tool (such as EDM or water/abrasive jet) to adjust the resistance of the resistor. It would be useful to be able to use resistance trimming to trim parallel resistors in a parallel stack to adjust the resistance of each resistor in the stack.

An optimum manufacturing system would produce resistors that all had the same resistance value, and then provide a system for trimming all the resistors in the stack of parallel resistors to adjust each resistor an equal amount to produce the desired total resistance of the stack of parallel resistors. Such a system would ensure that the effect of the failure of any one resistor in the stack would be the same as the failure of any other resistor in the stack. This predictability facilitates the fault tolerance design of the overall data communication system.

As an aid to the manufacturing process and also for shipping and receiving inspections it would be useful to provide an instrument for confirming that the data bus with the attached terminating resistor is in fact adjusted to adequately absorb signals incident on the end of the data bus to preclude reflection of signals strong enough to interfere with the operation of the data bus. There are many test instruments for testing the integrity of a data bus to confirm that the line replacable units and the data bus controller are capable of transmitting and receiving the signals accurately, but no instrument exists for nonintrusively measuring the resistance of a resistor on the end of a data bus, that is, measuring the resistance without cutting through the insulation on the data bus wires or the insulation on the resistor itself.

The terminating resistor in an avionic data bus for an aircraft must be mechanically robust so as to resist the inevitable vibration, mechanical handling, and thermal cycling to which it will be subjected during the operation over the lifetime of the airplane. It must be capable of withstanding impacts from being dropped and so forth, pulling forces exerted by the data bus on the terminating resistor, and bending forces between the data bus and the terminating resistor. Each constituent resistor must be a separate entity to preclude failures which could propagate to more than one element or common connection. In addition, vibration, which has the potential for establishing a resonant condition in the resistance elements, must be damped or prevented, as it could shorten the life of the terminating resistor by fatigue cracking in the resistor elements. These requirements militate for packaging the terminating resistor in a manner which will protect the electrical elements in the resistor from mechanical damage which would otherwise occur from the normal expected abuse that it would experience during the lifetime of the airplane, and also ensure that the electrical characteristics remain constant within the permissible range during that same time period.

To ensure that the capacitance of each conductor of the bus cable is balanced, a metal shell is provided around the resister pack and the spacing between the conductors and the metal shell is maintained equal for both conductors by a foam sleeve. This protects the resistor pack and also ensures balanced capacitance of each conductor.

SUMMARY OF THE INVENTION

Accordingly, it is an object of this invention to provide an improved fault tolerant terminating resistor for an avionics system data bus. It is another object of this invention to provide an improved terminating resistor which has a reliability exceeding the reliability of the data bus conductor over the projected life of the airplane on which it is to be used based on an inspection period equal to the life of the airplane.

It is another object of the invention to provide an improved terminating resistor for an avionics system data bus which is sufficiently robust to withstand the mechanical abuse to which it will be subjected during installation and use during the lifetime of the airplane.

It is a further object of the invention to provide a method of absorbing signals incident on the end of an avionics system data bus so that no signals of significant amplitude are reflected back along the data bus and wherein a failure of one of the resistive elements in the terminating resistor does not result in operational failure of the terminating resistor.

It is still another object of the invention to provide an improved process for making a terminating resistor for an avionic system data bus which results in a fault tolerant high reliability terminating resistor whose expected lifetime exceeds the lifetime of the airplane on which it will be used.

It is a still further object of the invention to provide an improved method and apparatus for nonintrusively testing a terminating resistor on an avionics system data bus which enables the data bus and the terminating resistor to be tested during production without breaking the insulation on the data bus or the terminating resistor at any point.

A yet still further object of the invention is to provide an improved assembly process for making a terminating resistor according to this invention.

These and other objects of the invention are attained in a terminating resistor and a process for making the resistor integrally formed on the end of a data bus with at least about twenty resistive elements connected in parallel directly across the conductors of the data bus and soldered thereto by reflow soldering techniques. The resistive elements each include a ceramic coupon on which a film resistor is deposited, and trimable elements may be provided on the face and/or edge of the ceramic coupon which enable the resistor to be trimmed so that each of the resistive elements in the terminating resistor can be trimmed with the same electrical effect on each resistive element. The resistors are securely packaged with shock absorbing material between each individual resistive element and with a cylinder of shock absorbing material completely surrounding the entire assembly, and then is enclosed in a metal can which is crimped at one end and secured to a bend angle control strain relief between the data bus and the protective can covering. A method of testing the data bus and terminating resistor involves inductively coupling a signal generator to the data bus to produce a signal on the data bus and sensing whether the terminating resistor absorbs the reflections from the end of the data bus with a inductively coupled sensor on the data bus.

DESCRIPTION OF THE DRAWINGS

The invention and its many attendant objects and advantages will become more apparent upon reading the description of the preferred embodiment in conjunction with the following drawings, wherein.

DESCRIPTION OF THE PREFERRED EMBODIMENT

Figures 1, 2, 3:
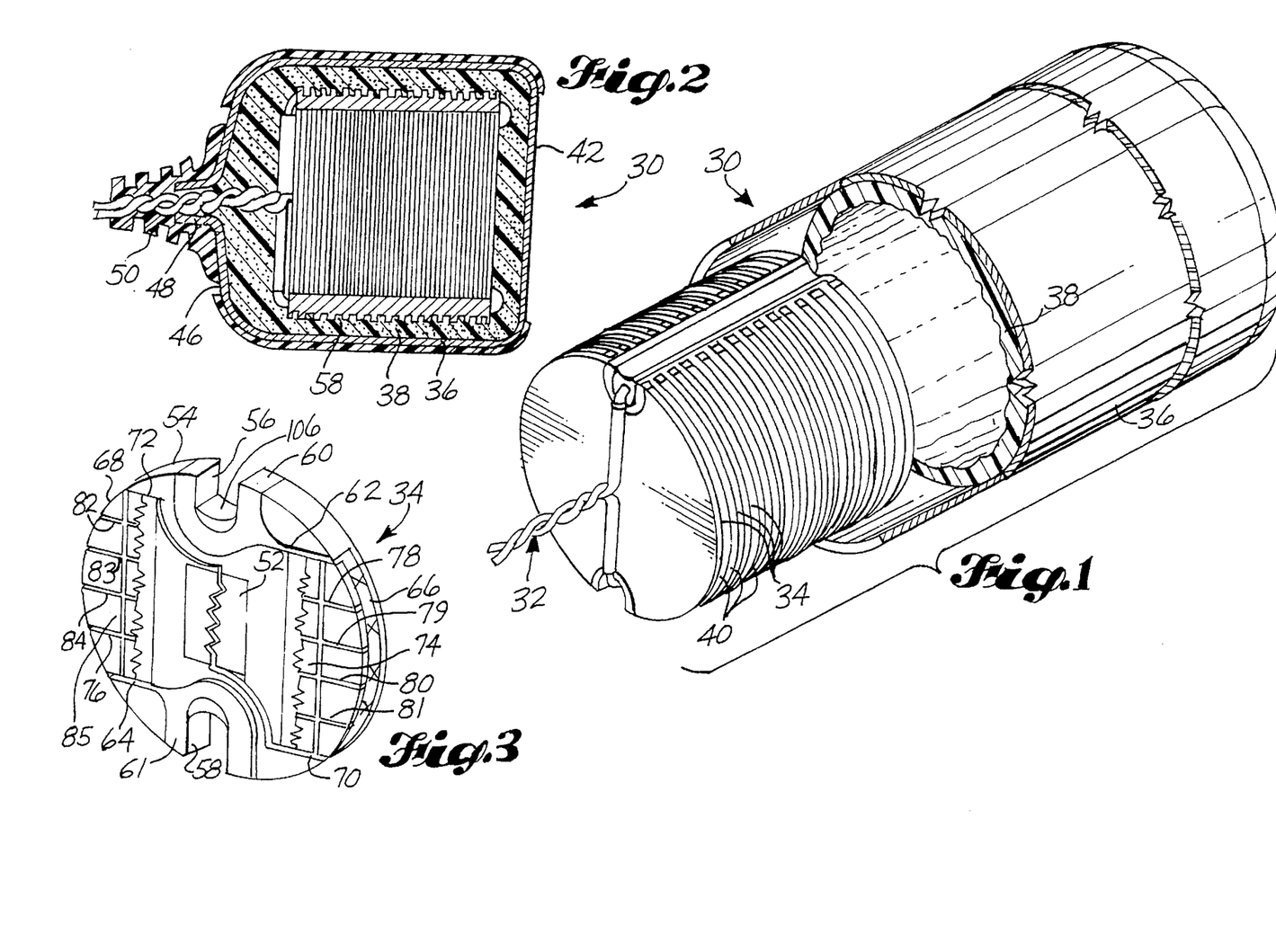
FIG. 1 is a perspective view of a stack of resistive elements of a terminating resistor according to this invention exploded out of a protective can in which the assembly is contained.
FIG. 2 is a cross sectional elevation of the terminating resistor of FIG. 1.
FIG. 3 is a perspective view of one of the resistive elements of the terminating resistor shown in FIG. 1.

Referring now to the drawings, wherein like reference characters designate identical or corresponding parts, and more particularly to FIG. 1 thereof, a terminating resistor 30 for a data bus 32 is shown having a stack of resistor elements 34 connected in spaced parallel relationship across the ends of two conductors of the data bus 32. The stack of resistor elements 34 is contained within a metal can 36 which is lined with a shock absorbing foam liner 38 to protect the stack of resistive elements 34 from shock and other mechanical damage. A foam disk 40 made of a stable elastomeric foam which is chemically compatible with the other materials in the assembly is placed between each of the resistor elements 34 to absorb vibration and prevent the stack of resistor elements 34 from resonant vibration which could cause early fatigue damage to the elements or to the film resistors deposited thereon.

As shown in FIG. 2, the foam liner 38 spaces the resistor elements 34 uniformly from the sides of the metal can 36 so that the capacitance between the can and the two conductors of the data bus 32 at the connection of the resistor elements 34 is equal. FIG. 2 also shows the elastomeric liner 38 surrounding the entire terminating resistor assembly extending between the bottom 42 of the can 36 and the end resistor element 34 to provide shock absorption and spacing therebetween. The liner 38 has a top portion 44 which covers the top of the stack of resistor elements 34 and lies between it and the top or front end 46 of the can 36. The front end 46 of the can 36 is necked down at 48 around the data bus 32 and has a radius controlled strain relief 50 bonded to the necked down portion 48 and the top end 46 of the can 36 to absorb axial and sideways forces exerted on the data bus 32. These features preclude the entry of water or other impurities into the interior of the can 42.

Turning now to FIG. 3, an individual one of the stack of resistor elements 34 shown in FIGS. 1 and 2 is shown having a thick film primary resistor 52 deposited on one side of a cylindrical disk shaped ceramic coupon 54. Each resistor element is deposited on its own ceramic disc so that, if one of the discs cracks, only one resistor element fails. The thick film primary resistor 52 preferrably is electrodeposited metal such as nickel or nickel-chromium on the ceramic coupon 54, or it could be a number of other commercially available thick film resistive materials deposited on the coupon. The ceramic coupon 54 is preferrably a ceramic disk, such as barium titanate, having high resistivity and good properties of strength and thermal and dimensional stability, and is available at low cost. Other constructions are available and could be used such as a metal foil resistive element on a polyimide substrate, cemented to a polyimide printed circuit board.

The cylindrical coupon 54 has two openings, such as notches 56 and 58, on or adjacent the edge of the coupon at diametrically opposed edges thereof. The edges and the marginal portions around the edges are coated with a conductive and solderable coating such as electrodeposited copper or silver which facilitates the electrical and mechanical connection of the coupon 54 to the leads of the data bus 32. The coating 60 of conductive material around the marginal portions of the notches 56 and 58 is continued in a ribbon 62 and 64 which extends from around the notches 56 and 58 over to the edge of the ceramic coupon 54. At the edge of the coupon, the ribbons 62 and 64 extend around the edge of the coupon 54 in a contiguous portion 66 and 68 for about ninety degrees. Connecting ribbons 70 and 72 connect the edge ribbons 66 and 68 to the thick film primary resistor 52. In this way, a circuit is established from the notch 56, along the ribbon 62, around the edge ribbon 66 and connecting ribbon 70, through the primary resistor 52, and then back through the connecting ribbon 72, edge ribbon 68, and ribbon 64 to the notch 58 putting the thick film primary resistor 52 electrically between the two leads of the data bus 32. Putting the notches 56 and 58 on diametrically opposite side of the disc maximizes the likelihood that the predominant failure mode will be an open circuit rather than a short. Since all of the resistive elements 34 are substantially identical, the primary resistors 52 on all of these resistive elements are in a parallel electrical circuit between the leads of the data bus 32.

Two tracks 74 and 76 of resistive material such as vapor-deposited nickle or nickle chrome alloy or the like providing stable resistance with temperature are deposited on the ceramic coupon 54. The band 74 extends between and contacts the ribbon 62 and the connecting ribbon 70, and the band 74 extends between the ribbon 64 and the connecting ribbon 72. Four equally spaced bridging ribbons 78, 79, 80 and 81 extend from the band 74 to the edge ribbon 66, and a corresponding series of four bridging ribbons 82, 83, 84, and 85 extend from the band 76 to the edge ribbon 68.

The circuit of the coupon shown in FIG. 3 is thus a primary resistor 52 connected across the notches 56 and 58 into which the two conductors of the data bus 32 are soldered. The secondary resistors represented by portions of the resistive bands 74 and 76 are shorted by the edge ribbons 66 and 68 and are not normally in the circuit. However, if it is desired to put a portion of the resistive band 74 and 76 in series with the primary resistor 52, an appropriate portion of the edge ribbons 66 and 68 may be cut, as by laser or abrasive trimming. For example, assuming that the portion of the resistive band 74 between the ribbon 62 and the bridging ribbon 78 is to be put into series with the primary resistor 52, it would merely require the passage of a laser beam across the edge of the coupon 54 between the ribbon 62 and the bridging ribbon 78 to sever the edge ribbon 66 between those two connection points. The current from the notch 56 and its conductive coating would then flow through the ribbon 62 and through the top portion of the resistive band 74 between the ribbon 62 and the bridging ribbon 78. The current would then flow out through the bridging ribbon 78 and be conducted through the balance of the edge ribbon 66 to the connecting ribbon 70 and then to the primary resistor 52.

It may be desirable to balance the capacitance between the can 36 and both sides of the primary resistor 52 when adding secondary resistance in series with the primary resistor 52. This can easily be done by severing the edge ribbon 66 and the edge ribbon 68 at diametrically opposed positions in a manner that will add an equal amount of resistance in series with the primary resistance 52 on both sides of that primary resistor.

Figure 4:
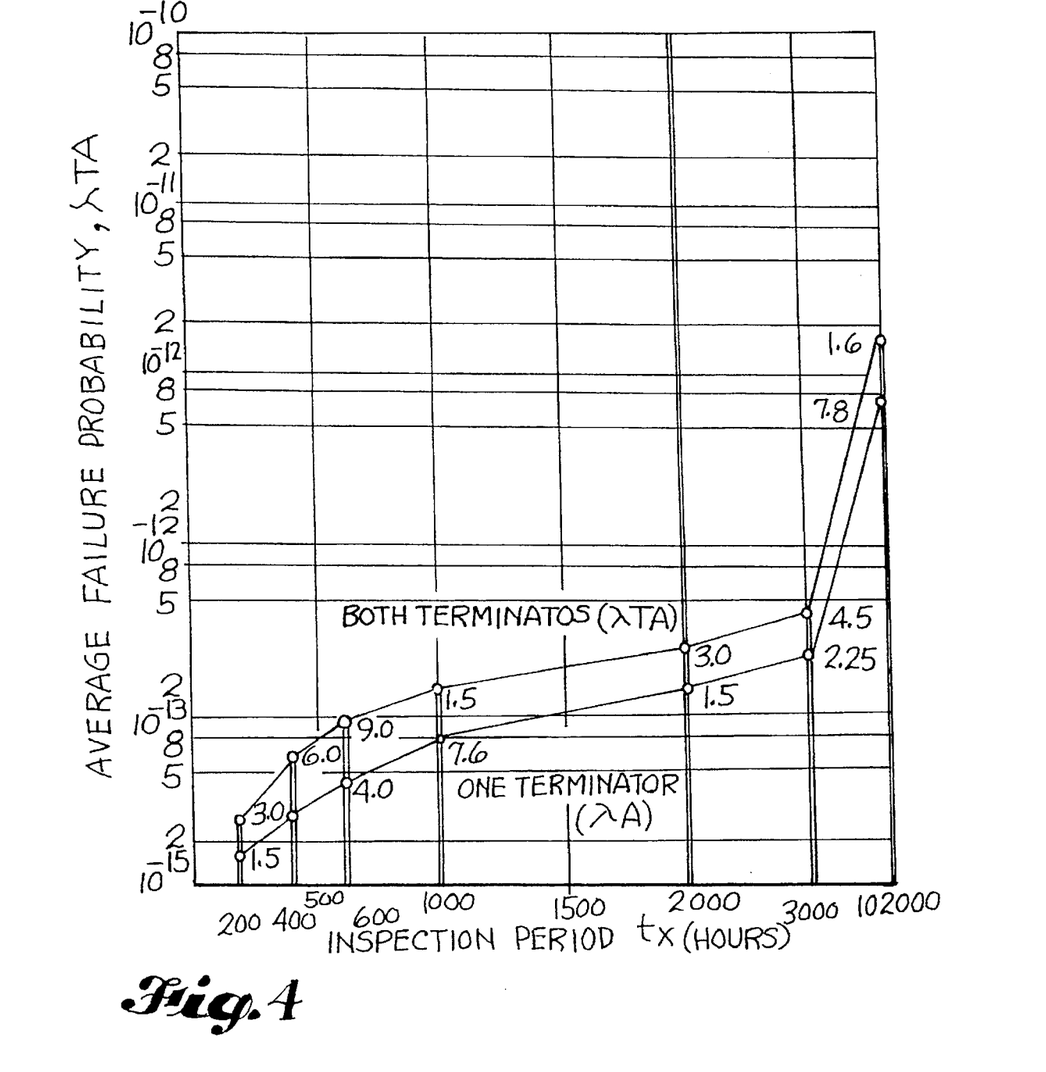
FIG. 4 is a graph showing the average probability of failure of a terminating resistor according to the invention as plotted against time.

The terminating resistor 30 disclosed herein has an average failure probability which exceeds the life of the data bus, which in turn exceeds the design life of the airplane. The failure probability, illustrated in FIG. 4, is optimized by directly reflow soldering the data bus conductors to the resistance elements and packaging the resistive elements in shock absorbing material within a rugged metal can, which is coupled to the data bus conductors by a radius control strain relief as shown in FIG. 2. The use of twenty resistive elements in parallel decreases the reliability, but the failure rate of each resistor is so low that the reliability of the system still exceeds the design life of the airplane. The advantage of twenty resistive elements in parallel is the fault tolerance obtained thereby. If one of the resistive elements fails, it is designed to fail by opening rather than shorting and the resistance of the terminating resistor will increase by only five percent. An increase of five percent will cause a slight increase in the reflection of the input signal, but the reflections can remain well below the signal to noise ratio established for the communications system.

Figures 5, 6:
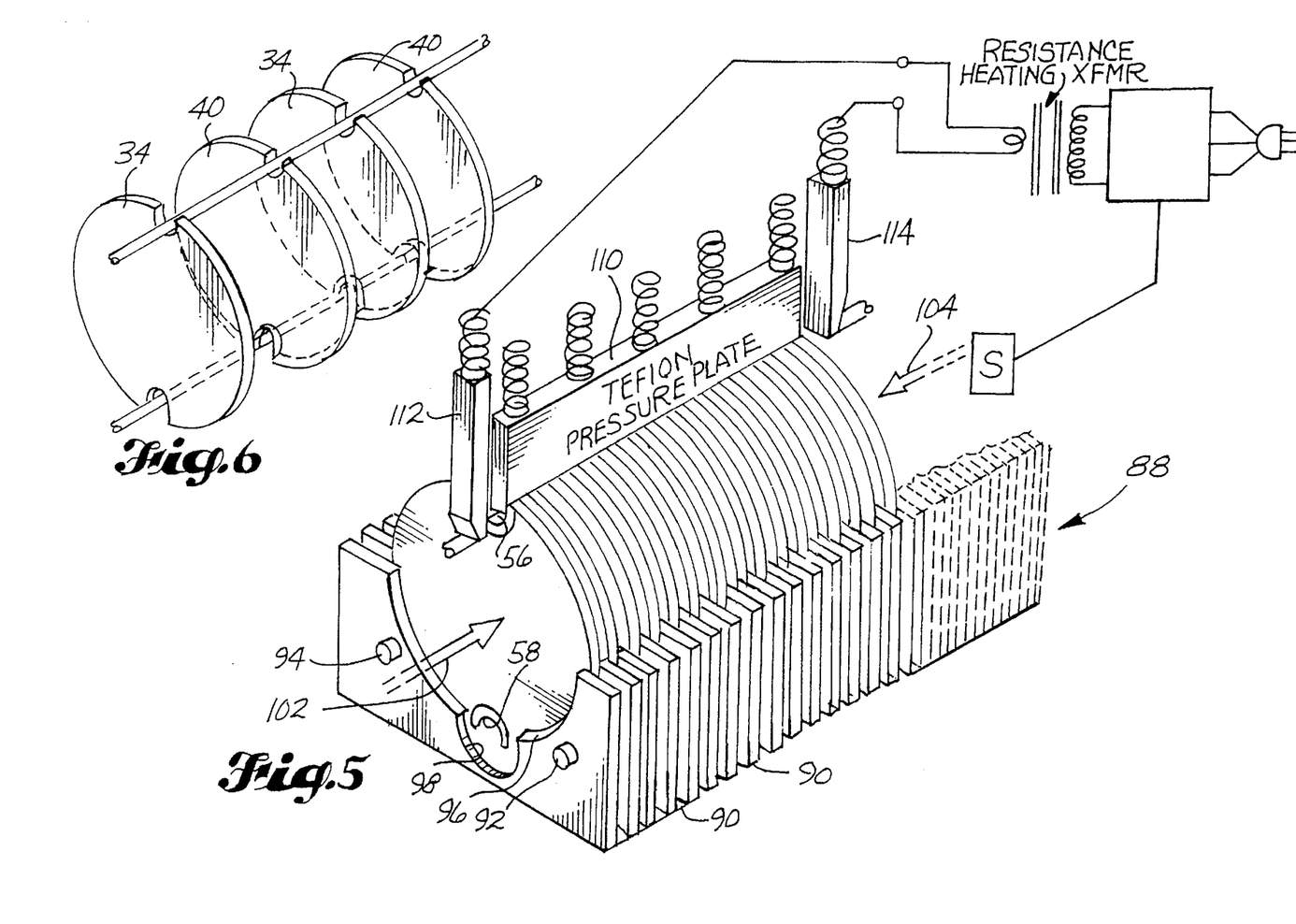
FIG. 5 is a schematic diagram showing an assembly tool for reflow soldering the resistive elements to form the assembly shown in FIG. 1.
FIG. 6 is an expanded perspective view showing how the resistive elements of the terminating resistor shown in FIG. 1 interleave with spacers and connect to the conductors of the data bus cable.

Turning now to FIGS. 5 and 6, an assembly jig for assembling the resistive elements 34 into a parallel stack and soldering the data bus lead wires into the notches 56 and 58 is shown having a series of spacer supports 90 held in spaced parallel relationship by a pair of dowel pins 92 and 94 and by underlying support structure (not shown) such as a grooved support into which the spacer supports fit. Each of the spacer supports 90 is identical in design and includes an arcuate cut-out 96 slightly smaller in radius than the radius of the coupons 54. At the bottom of the arcuate cut-out is a second smaller arcuate cut-out 98 which aligns with the notches 58 in the bottom of the ceramic coupons 54.

To assemble the terminating resistor 30, the resistive elements 34 are slipped between the spacer supports 90 and rest on the dowels 92 and 94. A foam spacer disk 40 is inserted between each of the ceramic coupons 54 and rests on the arcuate cut-out 96 of the spacer supports 90. The foam spacer disks 40 have a diameter slightly smaller than the diameter of the ceramic coupon, and the arcuate cut-outs 96 of the spacer supports 90 position the foam spacer disks 40 exactly coaxially relative to the axis of the resistive element, 34.

After the stack of resistive elements 34 and foam spacer disks 40 are assembled in the assembling jig light pressure is applied in the direction of the arrows 102 and 104 to squeeze the ceramic coupons against the foam spacer disks and establish a firm, intimate contact between the foam spacer disks and the ceramic coupons 54. To provide the necessary clearance for the small translation of the elements 34 inward toward each other as they compress the foam in the foam spacer disks 40, the thickness of the spacer supports 90 is less than the thickness of the foam spacer disks 100 so that the resistive elements 34 do not engage the sides of the spacer supports 90 when the assembly is squeezed.

The stack of resistive element 34 and spacer disks 40 is now mechanically secured together and simultaneously connected electrically by means of reflow soldering the leads of the data bus 32 in the aligned notches 56 and 58 of all twenty resistor elements This is accomplished by inserting the actual ends of the data bus conductors, from which the insulation has been stripped, into the notches 56 and 58, previously partially filled with a small puddle 106 and 108 of solder which has been melted and refrozen in place for that purpose. Using the actual data bus conductors is important avoids the possibility of single point failure between the data bus cable and the terminating resistor. The wires are laid in the notches 56 and 58 and pressed against the solder puddles with a light pressure from a Teflon pressure plate 110. A pair of electrical contacts 112 and 114 contact the data bus leads adjacent to the ends of the stack of resistive elements 34 and a large current is passed through the wire to heat the wire and remelt the solder puddles 106 and 108. The ram 110 presses the wire into the bottom of the notches 56 and 58 so that the reflowed solder bonds the wire to the conductive coating 60 and 61 around the edges of the notches 56 and 58. The use of reflow soldering is specified in MIL Handbook 217 as the most reliable electrical connection, although there are numerous methods of reflow soldering which would be acceptable for this application.

Figure 7:
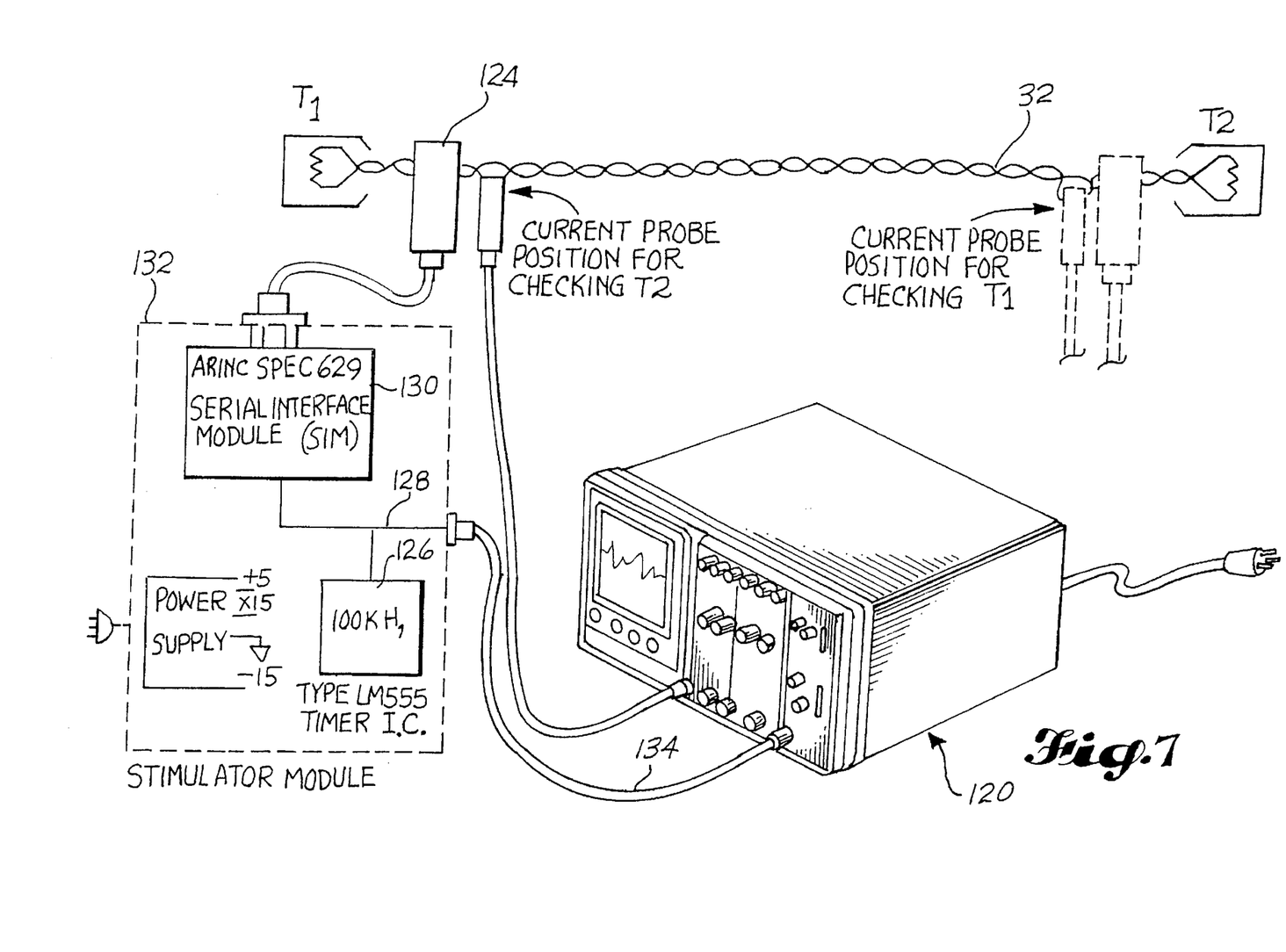
FIG. 7 is a schematic diagram of a test apparatus for testing the condition of the terminating resistors on a data bus according to this invention.
Figure 8:
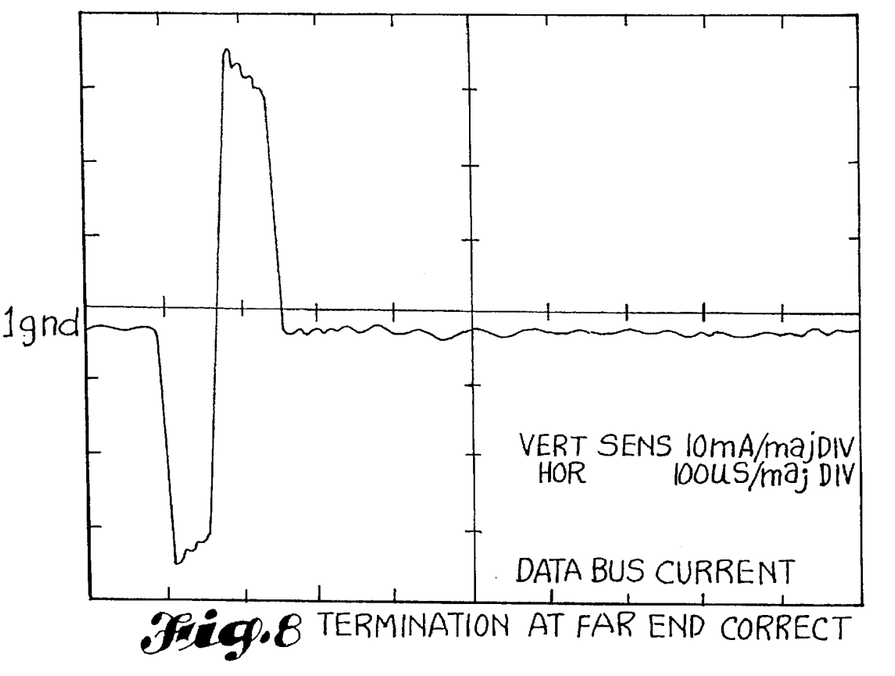
FIGS. 8–11 are graphs illustrating sample oscilliscope traces which would be seen on the test apparatus of FIG. 7 in various conditions of the terminating resistor of this invention.
Figure 9:
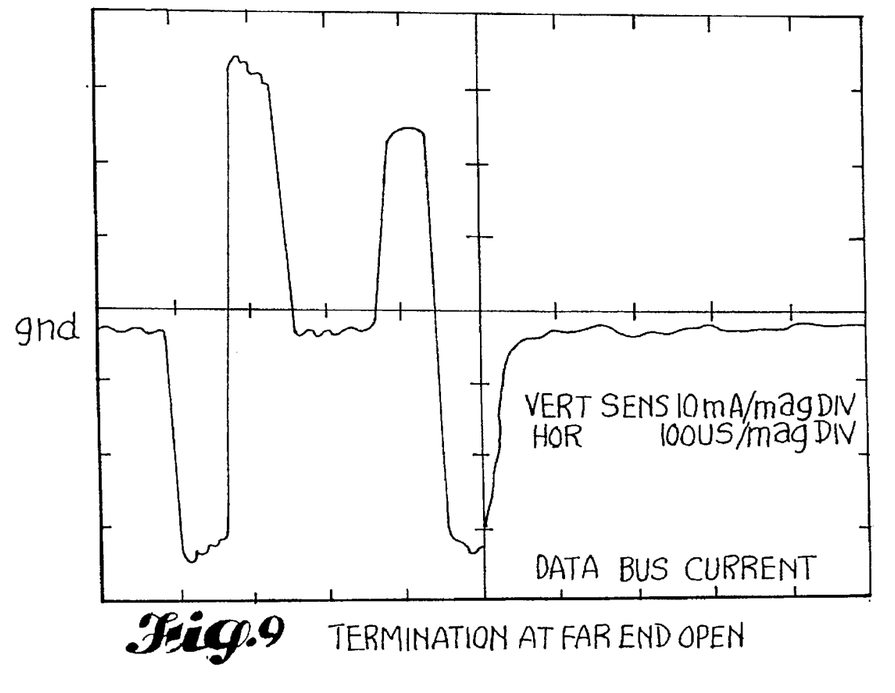
Figure 10:
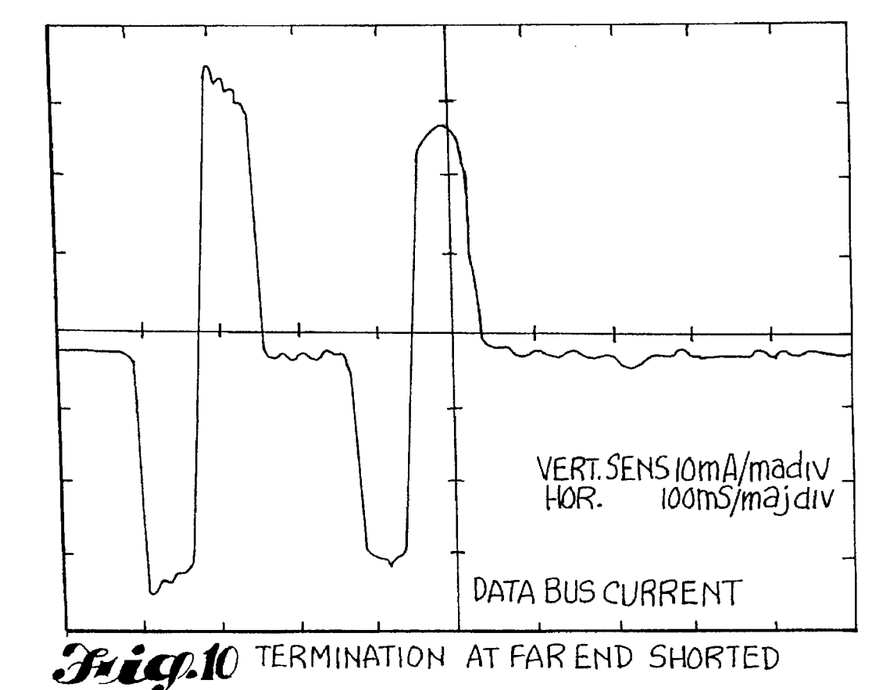
Figure 11:
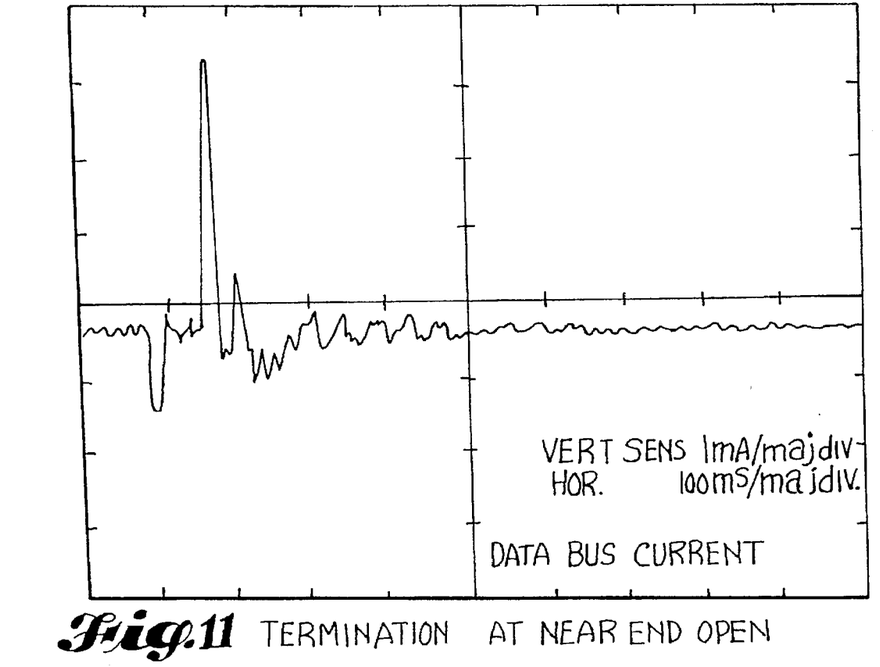

Turning now to FIG. 7, a test apparatus for testing the electrical quality of the cable and terminating resistors comprising the data bus assembly is shown having a 100 megahertz test oscilloscope and signal generator 120, such as a Tektronix Model TDS-420 which can be coupled to the data bus through a stimulator module 122 and a coupler 124 of the type described in U.S. Pat. No. 4,264,827. As shown in FIG. 7, the stimulator module includes a repetition rate generator 126 such as a Type LM555 timer I.C. available from National Semiconductor connected through a conductor 128 to an ARINC Specification 629 Serial Interface Module 130 to a coupling on the stimulator module housing 132. A trigger cable 134 connects the oscilliscope 120 to the stimulator module 122 for coordination of timing. The signal is generated by a pulse generator 126 which operates at a repetition rate of 100 KHz. This is converted by the serial interface module 130 (also discussed in the above patent) to produce a six megahertz doublet on the data bus at a repetition rate of 100 kilohertz. This signal, shown in FIG. 8, propagates along the data bus until it reaches the terminating resistor 30. If the terminating resistor 30 is purely resistive and has a resistance equal or about equal to the characteristic impedence of the data bus, the signal will be entirely absorbed or reduced in amplitude below the level at which it could interfere or distort the other signals on the data bus, as shown in FIG. 8. On the other hand, if the terminating resistor 30 at the far end of the data bus is open, significant reflections propagate back along the data bus and are picked up by a current probe 126, such as a Tektronix Model P-6022. If the reflections are large in amplitude as shown in FIGS. 9 and 10, an open or short condition exists in the cable or terminating resistor 30. If the reflection is in phase with the transmitted doublet, then a short exists. If the reflection is out of phase, an open circuit exists. An open terminating resistor 30 at the near end adjacent the location of the current probe will result in total loss of signal as shown in FIG. 11.

If no reflection or minimal reflection is observed on the oscilloscope, as illustrated in FIG. 8, then the cable under test is optimally or adequately terminated by a terminating resistor 30 which is correctly sized and properly installed.

Obviously, numerous modifications and variations of the disclosed terminating resistor and the method of testing the quality of the terminating resistor and data bus will occur to a person skilled in the art in view of this disclosure. Accordingly, it is expressly to be understood that these variations and modifications, and equivalents thereof, may be practiced while remaining within the spirit and scope of the invention as defined in the following claims, wherein I claim:

What is claimed is:

1. A process for making an integrated terminating resistor on a two-conductor data bus, comprising:

making a series of individual resistor elements;

assembling said resistor elements in a stack of parallel, spaced array of elements;

soldering said elements together between end portions of said two conductors of said data bus at both ends thereof to establish a parallel electrical connection and to connect the elements together mechanically in a closely spaced array; and sealing said array in a shock absorbing and abrasion resistant enclosure.

2. The process for making a terminating resistor for a two-conductor data bus as defined in claim 1, wherein;

said soldering step includes inserting said conductors into two diametrically opposed, axially aligned notches in all of said resistor elements; and heating solder in said notches to reflow said solder to bond each of said conductors in a respective one of said notches.

3. The process for making a terminating resistor for a two-conductor data bus as defined in claim 2, wherein;

said heating step includes passing a large electrical current through a portion of said conductor to resistively heat said portion of said conductor and said solder in said notch to melt said solder and reflow said solder onto said conductor.

4. The process for making a terminating resistor for a two-conductor data bus as defined in claim 3, further comprising;

pressing said conductors into said solder during said heating of said conductors to push said conductors into said solder as said solder melts.

5. The process for making a terminating resistor for a two-conductor data bus as defined in claim 4, further comprising;

compressing a resilient, shock absorbing disc between each two of said resistor elements while said conductors are soldered into said notches to unitary assembly that is insensitive to vibration.

* * * * *